United States Patent
Imai et al.

(10) Patent No.: US 9,153,664 B2
(45) Date of Patent: Oct. 6, 2015

(54) SEMICONDUCTOR DEVICE AND METHOD FOR FABRICATING THE SAME

(71) Applicants: Kiyotaka Imai, Seongnam-si (KR); Young-Gwon Kim, Busan (KR); Shigenobu Maeda, Seongnam-si (KR); Soon-Chul Hwang, Anyang-si (KR)

(72) Inventors: Kiyotaka Imai, Seongnam-si (KR); Young-Gwon Kim, Busan (KR); Shigenobu Maeda, Seongnam-si (KR); Soon-Chul Hwang, Anyang-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 14/285,649

(22) Filed: May 23, 2014

(65) Prior Publication Data

US 2015/0118817 A1   Apr. 30, 2015

(30) Foreign Application Priority Data

Oct. 29, 2013  (KR) .................. 10-2013-0129279

(51) Int. Cl.
*H01L 21/8234* (2006.01)
*H01L 29/66* (2006.01)
*H01L 29/78* (2006.01)
*H01L 21/02* (2006.01)
*H01L 21/266* (2006.01)

(52) U.S. Cl.
CPC .... *H01L 29/66545* (2013.01); *H01L 21/02667* (2013.01); *H01L 21/266* (2013.01); *H01L 21/823418* (2013.01); *H01L 29/7833* (2013.01)

(58) Field of Classification Search
CPC .................. H01L 21/02365; H01L 21/02436; H01L 21/02518; H01L 21/0257; H01L 21/8232; H01L 29/1025
See application file for complete search history.

(56) References Cited

U.S. PATENT DOCUMENTS

| | | | |
|---|---|---|---|
| 6,187,643 B1 | 2/2001 | Borland | |
| 6,518,623 B1 | 2/2003 | Oda et al. | |
| 2004/0197969 A1* | 10/2004 | Chen et al. | 438/161 |
| 2008/0083951 A1 | 4/2008 | Anderson et al. | |
| 2008/0124877 A1* | 5/2008 | Pei | 438/300 |
| 2009/0001371 A1* | 1/2009 | Mowry et al. | 257/51 |
| 2009/0114950 A1 | 5/2009 | Agarwal et al. | |
| 2011/0074498 A1* | 3/2011 | Thompson et al. | 327/543 |
| 2012/0083080 A1 | 4/2012 | Shifren et al. | |
| 2012/0299111 A1 | 11/2012 | Thompson et al. | |
| 2013/0020639 A1 | 1/2013 | Thompson et al. | |

* cited by examiner

*Primary Examiner* — Cheung Lee
(74) *Attorney, Agent, or Firm* — Muir Patent Law, PLLC

(57) ABSTRACT

A method for fabricating a semiconductor device is provided, which includes forming a screen layer on a substrate, the screen layer including a first portion doped with a first type impurity, forming a first undoped semiconductor layer on the screen layer, forming a gate structure on the first semiconductor layer, forming a first amorphous region on both sides of the gate structure in the first semiconductor layer, and re-crystallizing the first amorphous region through performing a first heat treatment of the first amorphous region.

17 Claims, 16 Drawing Sheets

SEMICONDUCTOR DEVICE AND METHOD FOR FABRICATING THE SAME

CROSS-REFERENCE TO RELATED APPLICATIONS

This application is based on and claims priority to Korean Patent Application No. 10-2013-0129279, filed on Oct. 29, 2013 in the Korean Intellectual Property Office, the disclosure of which is incorporated herein in its entirety by reference.

BACKGROUND

The present disclosure relates to a semiconductor device and a method for fabricating the same.

As the feature size of a MOS transistor is decreased, the lengths of a gate and a channel that is formed below the gate become short. As the size of the MOS transistor is decreased, power consumption of the MOS transistor is decreased, and thus the density of the MOS transistor is increased.

However, in recent MOS transistors, it becomes difficult to decrease the power consumption of the MOS transistor while reducing the size of the MOS transistor.

Accordingly, in a MOS transistor having a short channel, various research has been conducted to decrease the operating voltage that exerts an influence on the power consumption of the MOS transistor.

SUMMARY

Certain disclosed embodiments provide a method for fabricating a semiconductor device, which can suppress a short channel effect and decrease variation of a threshold voltage.

Certain embodiments provide a semiconductor device, which can suppress a short channel effect and decrease variation of a threshold voltage.

Additional advantages, subjects, and features of the disclosed embodiments will be set forth in part in the description which follows and in part will become apparent to those having ordinary skill in the art upon examination of the following.

In one exemplary embodiment, there is provided a method for fabricating a semiconductor device comprising: forming a screen layer on a substrate, the screen layer including a first portion doped with a first type impurity in the range of 7E18 to 1E20; forming a first undoped semiconductor layer on the screen layer; forming a gate structure on the first semiconductor layer; forming a first amorphous region on both sides of the gate structure in the first semiconductor layer; and re-crystallizing the first amorphous region through performing a first heat treatment of the first amorphous region.

In another exemplary embodiment, there is provided a method for fabricating a semiconductor device comprising: forming a screen layer on a substrate, the screen layer including a portion doped with a first type impurity; forming an undoped semiconductor layer on the screen layer using an epitaxial process; forming a gate structure on the semiconductor layer; forming an amorphous region, which does not come in contact with the screen layer, in the semiconductor layer through performing a PAI (Pre Amorphous ion Implantation) process using the gate structure as a mask; and forming a re-crystallization region on both sides of the gate structure through performing heat treatment of the amorphous region.

In another embodiment, a method of providing a semiconductor device includes: providing a semiconductor substrate; providing a screen layer on the semiconductor substrate, including a portion doped with a first type impurity; providing an undoped semiconductor layer on the screen layer, such that the screen layer is between the semiconductor substrate and the undoped semiconductor layer; providing a gate structure on the semiconductor layer; providing a source/drain expansion region in the semiconductor layer, the source/drain expansion region having a second type impurity different from the first type, and the source/drain expansion region extending from a surface of the semiconductor layer to a first depth within the semiconductor layer; and providing a source/drain region on both sides of the gate structure, the source/drain region including at least part of the source/drain expansion region, the source/drain region extending from the surface of the semiconductor layer to a second depth within the semiconductor layer different from the first depth. The source/drain region does not contact the screen layer.

BRIEF DESCRIPTION OF THE DRAWINGS

The above and other objects, features, and advantages will be more apparent from the following detailed description taken in conjunction with the accompanying drawings, in which.

DETAILED DESCRIPTION

Figure 1:
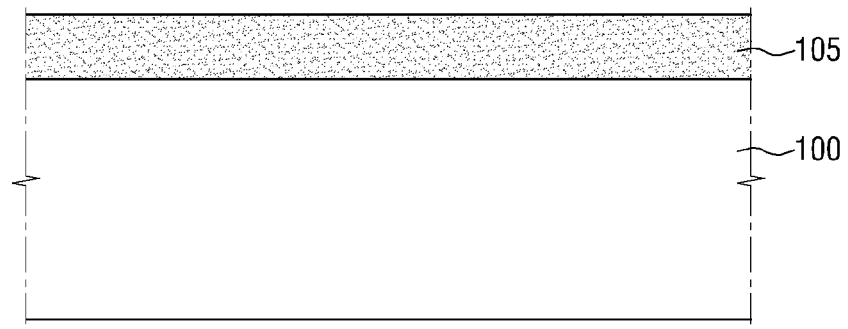
FIGS. 1 to 7 are views of intermediate steps explaining an exemplary method for fabricating a semiconductor device according to a first embodiment.

Advantages and features of the present disclosure and methods of accomplishing the various examples may be understood more readily by reference to the following detailed description of certain embodiments and the accompanying drawings. The present inventive concept may, however, be embodied in many different forms and should not be construed as being limited to the embodiments set forth herein. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. The term "contact," however, when used in the context of different physical portions of a device, and unless specifically indicated otherwise, refers to direct contact (i.e., touching).

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present inventive concept.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, referring to FIGS. 1 to 7, a method for fabricating a semiconductor device according to a first exemplary embodiment will be described.

FIGS. 1 to 7 are views of intermediate steps explaining a method for fabricating a semiconductor device according to a first exemplary embodiment. In particular, FIG. 2B is a graph illustrating the change of concentration of an impurity with respect to the depth from a surface illustrated in FIG. 2A.

Referring to FIG. 1, a screen layer 105 doped with a first type impurity is formed on a substrate 100.

The substrate 100 may be made, for example, of bulk silicon or SOI (Silicon-On-Insulator). The substrate 100 may be a silicon substrate, or may include other materials, for example, indium antimonide, lead telluride, indium arsenide, indium phosphide, gallium arsenide, or gallium antimonide, but is not limited thereto. In the following description, it is assumed that the substrate 100 is a silicon substrate.

FIG. 1 illustrates the substrate 100 in which an impurity region is not formed. However, this is merely for convenience of explanation, and the substrate 100 is not limited to that illustrated in FIG. 1. For example, an n-type well and/or a p-type well may be selectively formed in the substrate 100.

As described above, the screen layer 105 doped with the first type impurity is formed on the substrate 100. The screen layer 105 may decrease RDF (Random Dopant Fluctuation) of the impurity that is included in a source/drain region of a transistor, and improve a threshold voltage of the transistor to achieve the improvement of reliability. In certain embodiments, the screen layer 105 is a shield region having high impurity concentration, which can make it possible to perform dynamic control of the threshold voltage of the transistor.

The screen layer 105 may be formed using, for example, an implantation process or a deposition process. As such, the screen layer 105 may form an implanted region separate from a non-implanted region described as substrate 100. Nonetheless, in certain embodiments, the screen layer 105 may be considered to be part of a substrate that includes substrate 100 and the screen layer 105.

In certain embodiments, the screen layer 105 includes a first portion 105a (shown in FIG. 2B) in the range of 7E18 to 1E20 atoms/cm$^3$. This will be described in further detail using FIGS. 2A and 2B.

The first type impurity that is doped into the screen layer 105 may differ depending on the type of the transistor that is formed on the substrate 100. If the transistor is a pFET, for example, the first type impurity that is doped into the screen layer 105 may be an n-type impurity. The n-type impurity that is doped into the screen layer 105 may be, for example, antimony (Sb), but is not limited thereto. In contrast, if the transistor is an nFET, the first type impurity that is doped into the screen layer 105 may be a p-type impurity. The p-type impurity that is doped into the screen layer 105 may be, for example, boron (B), but is not limited thereto. As such, in certain embodiments, the first type impurity that is doped into the screen layer 105 is an impurity having a type that is opposite to the type of the transistor that is formed on the substrate 100.

Figure 2A:
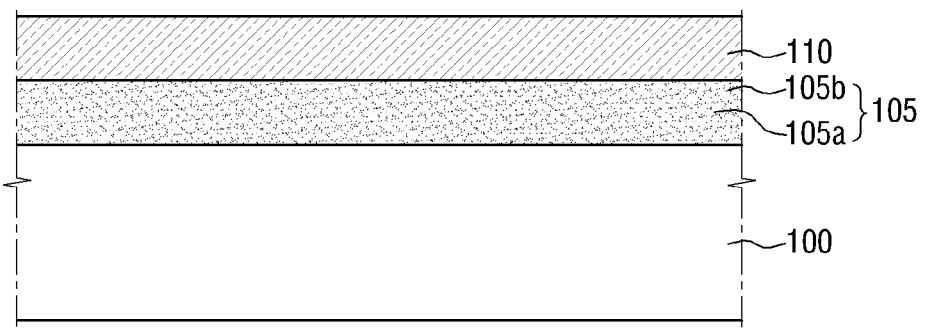
Figure 2B:
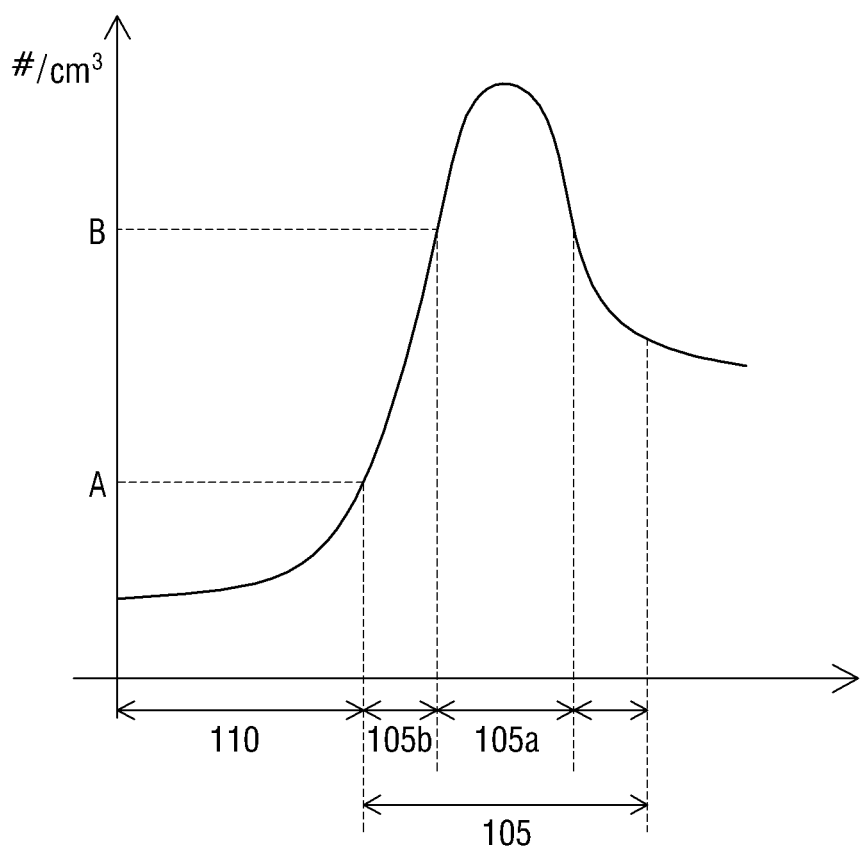

Referring to FIGS. 2A and 2B, a first semiconductor layer 110 is formed on the screen layer 105. Specifically, in one embodiment, the first semiconductor layer 110 is grown on the screen layer 105.

The first semiconductor layer 110 may be formed using, for example, an epitaxial growth process. Thus, the first semiconductor layer 110 may be an epitaxial layer that is formed on an upper surface of the screen layer 105. In this example, the first semiconductor layer 110 is formed to come in contact with the screen layer 105. Thus, in this example, the first semiconductor conductor layer 110 is directly adjacent to the screen layer 105.

In the method for fabricating a semiconductor device according to embodiments described herein, since the substrate 100 and the screen layer 105 may be made of silicon, the first semiconductor layer 110 may be a silicon epitaxial layer, but is not limited thereto.

The first semiconductor layer 110 may be an undoped semiconductor layer. Here, the term "undoped semiconductor layer" means a semiconductor layer that does not include an intentionally injected or doped impurity. For example, in the case of growing a semiconductor layer, the undoped semiconductor layer means a semiconductor layer into which a p-type impurity, an n-type impurity, or another impurity is not intentionally introduced. However, the undoped semiconductor layer may include an impurity that is diffused from an adjacent layer. Also, after part of a semiconductor layer is doped (e.g., to a particular depth), the remaining portion of the semiconductor layer may still be considered an undoped semiconductor layer.

Referring to FIG. 2B, the first semiconductor layer 110 may include the first type impurity that is equal to or smaller than A atoms/cm$^3$. For example, the first semiconductor layer 110 may include the first type impurity in the range of about 1E14 to A atoms/cm$^3$. Here, A may be a value in the range of about 1E14 to about 3E17. Further, although it is described that the lower limit of the concentration of the first type impurity that is included in the first semiconductor layer 110 is 1E14 atoms/cm$^3$, this is merely for convenience in explanation, but is not limited thereto. For example, the lower limit of the concentration of the first type impurity that is included in the first semiconductor layer 110 may be a value that is smaller than 1E14 atoms/cm$^3$.

If A is 1E17, the first semiconductor layer 110 may include the first type impurity in the range, for example, of 1E14 to 1E17 atoms/cm$^3$. The first type impurity that is included in the first semiconductor layer 110 may be the impurity that is diffused from the screen layer 105, but is not limited thereto.

The screen layer 105 may include a first portion 105a and a second portion 105b. The first portion 105a of the screen layer 105 may include the first type impurity that is equal to or larger than B atoms/cm$^3$. Here, B may be a value of, for example, 7E18. In one embodiment, the concentration of the first type impurity that is included in the first portion 105a of the screen layer 105 may be, for example, in the range of 7E18 to 1E20 atoms/cm$^3$. The first portion 105a of the screen layer 105 may be a portion that plays a major role of the screen layer 105.

The second portion 105b of the screen layer 105 may be a portion that is adjacent to the first semiconductor layer 110 (e.g., that is immediately adjacent the first semiconductor layer 110). In one embodiment, the second portion 105b of the screen layer 105 is a portion that contacts the first semiconductor layer 110. The second portion 105b of the screen layer 105 may include the first type impurity in the range, for example, of about A to about B atoms/cm$^3$. For example, if A is 3E17, the second portion 105b of the screen layer 105 may include the first type impurity in the range of 3E17 to 7E18 atoms/cm$^3$. The second portion 105b of the screen layer 105 may serve to control the threshold voltage of the transistor.

Figure 3:
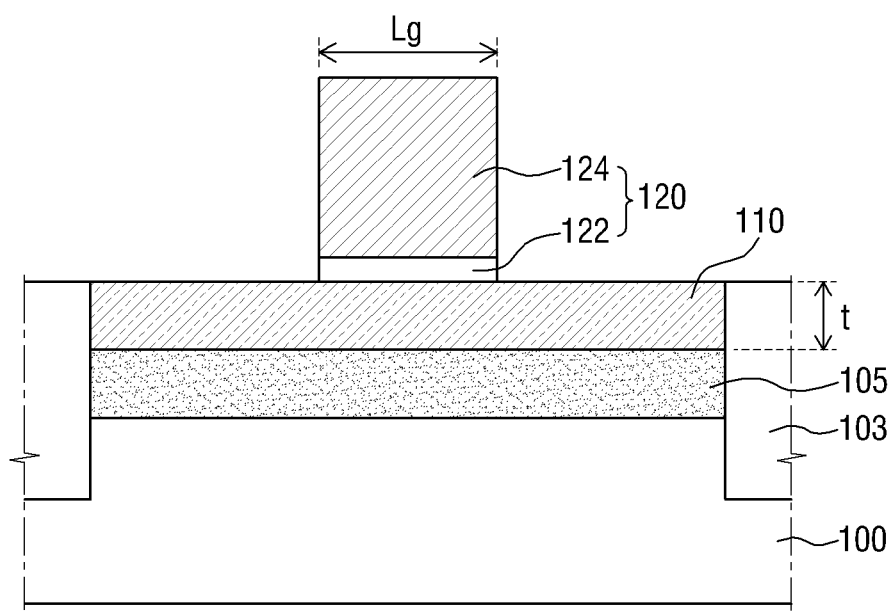

Referring to FIG. 3, an isolation layer 103 is formed in the first semiconductor layer 110, the screen layer 105, and the substrate 100.

The isolation layer 103 in one embodiment has superior isolation properties and a small occupation area, and thus may be formed to have a shallow trench isolation (STI) structure.

The isolation layer 103 may include, for example, one of silicon oxide, silicon oxynitride, silicon nitride, a combination thereof.

Then, a first gate structure 120 is formed on the first semiconductor layer 110. The first gate structure 120 includes a first gate insulating layer 122 and a first gate electrode 124. In one embodiment, the first gate insulating layer 122 and the first gate electrode 124 are sequentially formed on the first semiconductor layer 110.

The first gate insulating layer 122 may be, for example, a silicon oxide layer, a SiON layer, a GexOyNz layer, a GexSiyOz layer, a high-k dielectric layer, a combination thereof, or a stacked layer in which the above-described layers are sequentially stacked. The high-k dielectric layer may include, but is not limited to, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The first gate insulating layer 122 may be formed using, for example, heat treatment, chemical material processing, atom layer deposition (ALD), or chemical vapor deposition (CVD). If the first gate insulating layer 122 includes high-k dielectrics, a barrier layer (not shown) may be further formed between the first gate insulating layer 122 and the first gate electrode 124. The barrier layer may include, for example, at least one of titanium nitride (TiN), tantalum nitride (TaN), and a combination thereof.

The first gate electrode 124 may be made of, for example, silicon, and specifically may include one of poly silicon (poly Si), amorphous silicon (a-Si), titanium (Ti), titanium nitride (TiN), tantalum nitride (TaN), aluminum (Al), and a combination thereof. The poly silicon may be formed using, for example, chemical vapor deposition, and the amorphous silicon may be formed using, for example, sputtering, chemical vapor deposition, or plasma deposition, but is not limited thereto.

Although not illustrated in FIG. 3, a gate hard mask may be further formed on the first gate electrode 124. The gate hard mask may include, for example, a nitride layer, an oxide layer, or a combination thereof. The gate hard mask may be formed using, for example, chemical vapor deposition.

The width of the first gate structure 120, in the direction extending between the two depicted isolation layers, is shown as Lg, and the thickness, e.g., in a vertical direction, of the first semiconductor layer 110 that is formed on a lower portion of the first gate structure 120 is shown as t. In the method for fabricating a semiconductor device according to certain embodiments, the thickness t of the first semiconductor layer 110 may have a value in the range of about 0.25 Lg to about 0.5 Lg.

Figure 4:
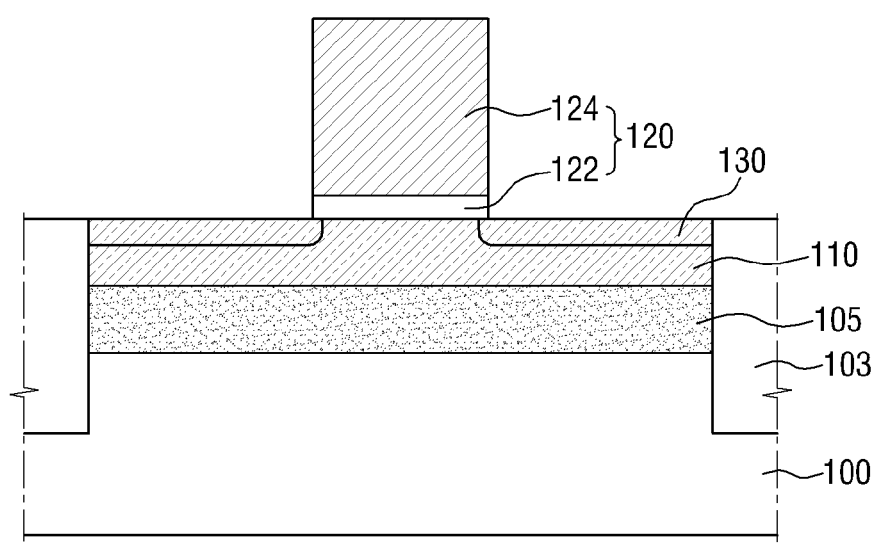

Referring to FIG. 4, a first source/drain expansion region 130 is formed on both sides of the first gate structure 120. The first source/drain expansion region 130 is formed inside the first semiconductor layer 110. The first source/drain expansion region 130 may also be described herein as a first source/drain expansion layer (e.g., within the first semiconductor layer 110).

For example, on the first semiconductor layer 110 on which the first gate structure 120 is formed, a liner layer may be formed along the upper surface of the first semiconductor layer 110 and the first gate structure 120.

Then, an impurity may be doped into the first semiconductor layer 110 on which the liner layer is formed using the first gate structure 120 as a mask. Through this, the first source/drain expansion region 130 is formed on both sides of the first gate structure 120. The first source/drain expansion region 130 may be formed using, for example, an implantation process. Then, the liner layer that is formed at least on the upper surface of the first semiconductor layer 110 may be removed.

In one embodiment, the impurity that is included in the first source/drain expansion region 130 is a second type impurity that is different from the first type impurity that is included in the screen layer 105. In one embodiment, if the transistor that is formed on the substrate 100 is a pFET, the screen layer 105 includes an n-type impurity, and the first source/drain expansion region 130 includes a p-type impurity. In contrast, if the transistor is an nFET, the screen layer 105 includes a p-type impurity, and the first source/drain expansion region 130 includes an n-type impurity. If the second type impurity that is included in the first source/drain expansion region 130 is a p-type impurity, the p-type impurity may be, for example, boron (B), while if the second type impurity that is included in the first source/drain expansion region 130 is an n-type impurity, the n-type impurity may be, for example, phosphorous (P), arsenide (As), or antimony As shown, the source/drain expansion region 130 may extend from a top surface of the first semiconductor layer 110 into the first semiconductor layer 110 to a certain depth. Also, as shown, the source/drain expansion region 130 may extend from the isolation region 110 to an edge of the first gate structure 120. A portion of the source/drain expansion region 130 may be formed beneath the edge of the first gate structure 120.

Figure 5:
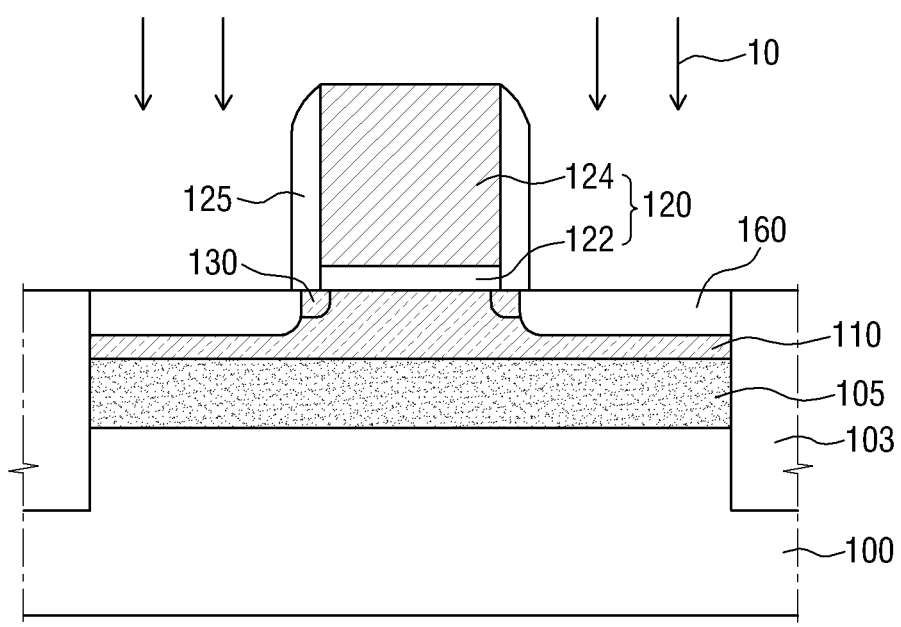

Referring to FIG. 5, a gate spacer 125 is formed on a side surface of the first gate structure 120.

The gate spacer 125 overlaps a part of the first source/drain expansion region 130. For example, as shown in FIG. 5, the first source/drain expansion region 130 is positioned on a lower portion of the gate spacer 125. In one embodiment, a bottom surface of the gate spacer 125 contacts a top surface of the first source/drain expansion region 130.

The gate spacer 125 may include, for example, a silicon nitride layer, a silicon oxynitride layer, a silicon oxide layer, or a SiOCN layer. The gate spacer 125 may be formed using, for example, chemical vapor deposition. The gate spacer 125 is illustrated to be formed as a single layer, but is not limited thereto. The gate spacer 125 may be formed as a multilayer.

Then, a first amorphous region 160, also described herein as a first amorphous layer 160, is formed on both sides of the first gate structure 120 through a first amorphization process 10. The first amorphous region 160 is formed inside the first semiconductor layer 110. For example, a part of the first semiconductor layer 110, which is not covered by the first gate structure 120 and the gate spacer 125, is amorphized.

The first amorphization process 10 may be, for example, a PAI (Pre-Amorphization ion Implantation) process. The first amorphous region 160 may be formed using the PAI process. In the first amorphization process 10, the first gate structure 120 and the gate spacer 125 may be used as a mask.

For example, the first amorphous region 160 may be formed through implantation of Ge or Si into the first semiconductor layer 110 that is exposed by the first gate structure 120 and the gate spacer 125. After Ge or Si is implanted into the first semiconductor layer 110, lateral diffusion may occur. Accordingly, the first amorphous region 160 may be formed to expand up to and at least partly beneath the lower portion of the gate spacer 125. In one embodiment, a bottom surface of the gate spacer 125 contacts a top surface of the amorphous region 160.

The first amorphous region 160 is formed in the first source/drain expansion region 130 that is formed inside the first semiconductor layer 110. As such, the first source/drain expansion region 130 that is not covered by the gate spacer 125 may be amorphized through the first amorphization process 10. As shown in FIG. 5, in one embodiment, the amorphous region 160 extends from a surface of the first semiconductor layer 110 into the first semiconductor layer 110 to a certain depth.

In the method for fabricating a semiconductor device according to one exemplary embodiment, the first amorphous region 160 that is formed inside the first semiconductor layer 110 does not come in contact with the lower screen layer 105. As shown in FIG. 5, the first amorphous region 160 is not directly adjacent to the lower screen layer 105. Since the first semiconductor layer 110 is positioned between the first amorphous region 160 and the screen layer 105, the screen layer 105 is not affected by the first amorphization process 10.

In one embodiment, the depth that is measured from the upper surface of the first semiconductor layer 110 to the lowermost portion of the first amorphous region 160 is smaller than the thickness of the first semiconductor layer 110.

Further, the first amorphous region 160 may be formed to be deeper than the first source/drain expansion region 130. Thus, the depth that is measured from the upper surface of the first semiconductor layer 110 to the lowermost portion of the first amorphous region 160 may be larger than the thickness of the first source/drain expansion region 130. The boundaries of different regions may be gradual rather than binary. In such a case, a boundary between two regions may be determined based on, for example, a threshold doping concentration or amount of amorphism. For example, concentrations above a threshold may be considered part of a region, and concentrations below a threshold may be considered not part of the region. The threshold region (e.g., the area where the threshold occurs) may be approximated to be a line or plane within a structure.

In one embodiment, when the PAI process is performed, the depth, in which the first amorphous region 160 is formed, may be adjusted through adjustment of ion implantation energy.

The second type impurity, which is different from the first type impurity that is included in the screen layer 105, may be doped into the first amorphous region 160. This is because the first amorphous region 160 may become the source/drain region through the subsequent fabricating process. The second type impurity that is doped into the first amorphous region 160 may be the same as the second type impurity that is included in the first source/drain expansion region 130, but is not limited thereto.

The doping of the second type impurity into the first amorphous region 160 may be performed using, for example, an implantation process.

Further, the doping of the second type impurity into the first amorphous region 160 may be performed after the first amorphization process 10 is performed, but is not limited thereto.

Figure 6:
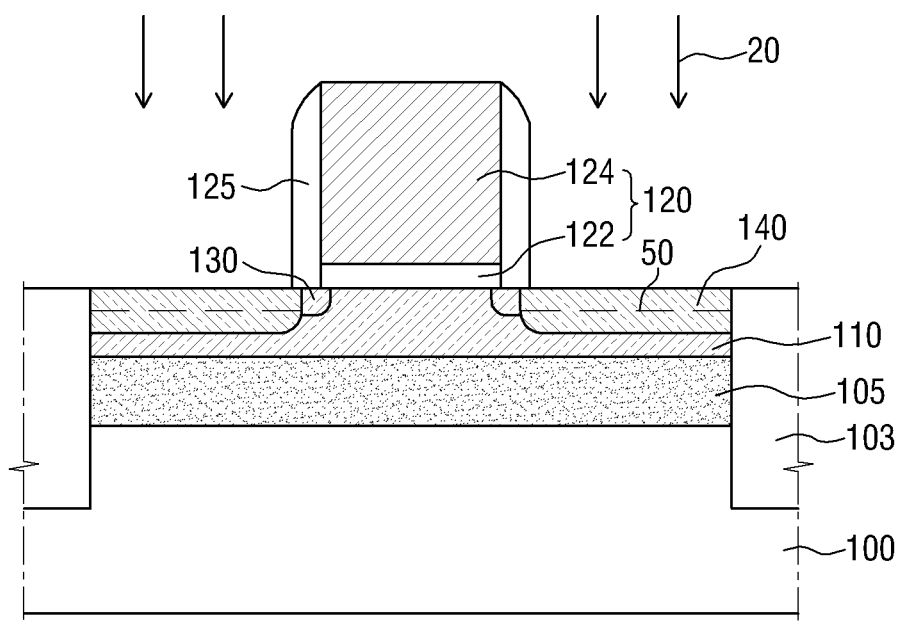

Referring to FIG. 6, by performing first heat treatment 20 with respect to the first amorphous region 160, the first amorphous region 160 is re-crystallized. By performing the first heat treatment 20 with respect to the first amorphous region 160, a first re-crystallization region 140, also described herein as a first re-crystallization layer 140 is formed on both sides of the first gate structure 120.

As a result, by re-crystallizing the first amorphous region 160 through the first heat treatment 20, the first source/drain region 140 may be formed on the first gate structure 120 and both sides of the gate spacer 125. The first source/drain region 140 may include the second type impurity included in the source/drain expansion region 130. The first source/drain region 140 may extend on each side of the gate structure 120, from the isolation layer 103 to an edge of the gate spacer 125. In one embodiment, it extends below the gate spacer 125. In addition, in one embodiment the first source/drain region 140 does not extend to beneath the gate structure 120, but the source/drain expansion region 130 does extend beneath the gate structure 120. Thus, a source/drain may include both the re-crystallization region 140 and the portion of the source/drain expansion region 130 that was doped but was not amorphized or re-crystallized (e.g., the portion beneath the gate spacer 125 and the gate structure 120).

Since the first source/drain region 140 is formed through re-crystallization of the first amorphous region 160, the first source/drain region 140, which is formed by the first heat treatment 20, does not come in contact with the screen layer 105. For example, the first semiconductor layer 110 is positioned between the first source/drain region 140 and the screen layer 105.

The first re-crystallization region 140 may be formed using, for example, a SPE (Solid Phase Epitaxy) process. The SPE process may include a low-temperature annealing process. In the SPE process, by performing the first heat treatment 20 in atmosphere including, for example, N2, H2, and O2, solid phase crystallization of the first amorphous region 160 that is doped with the second type impurity may be performed.

In the method for fabricating a semiconductor device according to certain disclosed embodiments, the first source/drain region 140 that is formed through the first heat treatment 20 may include stacking fault 50. The stacking fault 50 that is included in the first source/drain region 140 is positioned on the screen layer 105. The first amorphous region 160 is formed on the screen layer 105 without coming in contact with the screen layer 105, and the stacking fault 50 is positioned on the screen layer 105.

In the method for fabricating a semiconductor device according to certain exemplary embodiments, the first heat treatment 20 to form the first re-crystallization region 140 may be performed using SMT (Stress Memorization Technique).

As an example, during the recrystallization process of SMT, the crystals tend to grow at different rates in various crystallographic directions because the amorphous region is recrystallized under the stress induced therein by the stress inducing layer. For example, in the recrystallization process, the crystal growth rate may be greater in a <001> crystallographic direction than in a <110> crystallographic direction. In this case, a point at which crystal growth pinches off can appear near a (111) facet, thus creating a stacking fault. Thus, in one embodiment, a stacking fault may appear by using SMT.

Accordingly, the first amorphous region 160 that is doped with the second type impurity may be re-crystallized in a state where a lattice structure is modified, and thus the first re-crystallization region 140, that is, the first source/drain region 140 may continuously apply stress to the first semiconductor layer 110 that is below the first gate structure 120. As a result, since the first re-crystallization region 140 continuously applies the stress to the first semiconductor layer 110, the first re-crystallization region 140 increases the mobility of charge carriers, and thus the performance of the semiconductor device can be improved.

Although not illustrated in FIG. 6, a stress induction layer that covers the first gate structure 120 and the first amorphous region 160 may be further formed. Depending on the layer properties of the stress induction layer, the properties of the first re-crystallization region 140 that is re-crystallized through the first heat treatment 20 may differ. Depending on the layer properties of the stress induction layer, the first re-crystallization region 140 may apply tension stress or compression stress to the first semiconductor layer 110.

Hereinafter, effects of certain disclosed embodiments will be described when the first re-crystallization region 140 is re-crystallized through formation of the first amorphous region 160 that does not come in contact with the screen layer 105.

In conventional art systems, in the case of forming a first amorphous region by amorphizing at least a part of a screen layer through a first amorphization process, a first re-crystallization region that is formed through a first heat treatment may include a first type impurity that is included in the screen layer. Specifically, while the first heat treatment is performed, the first type impurity that is included in the screen layer may be diffused into the first amorphous region. Accordingly, the first type impurity that is included in the screen layer is decreased, and thus the screen layer is unable to effectively prevent the RDF (Random Dopant Fluctuation). Accordingly, the RDF of the second type impurity that is included in a first source/drain region is increased, and thus the performance and reliability of the semiconductor device may deteriorate.

However, if the first amorphous region 160 does not come in contact with the screen layer 105, as shown in the exemplary embodiments above, the diffusion of the first type impurity that is included in the screen layer 105 can be minimized although the first re-crystallization region 140 is formed through the first heat treatment 20. Accordingly, the screen layer 105 operates to decrease the RDF of the impurity that is included in the first source/drain region 140, and thus the performance and reliability of the semiconductor device can be improved.

Figure 7:
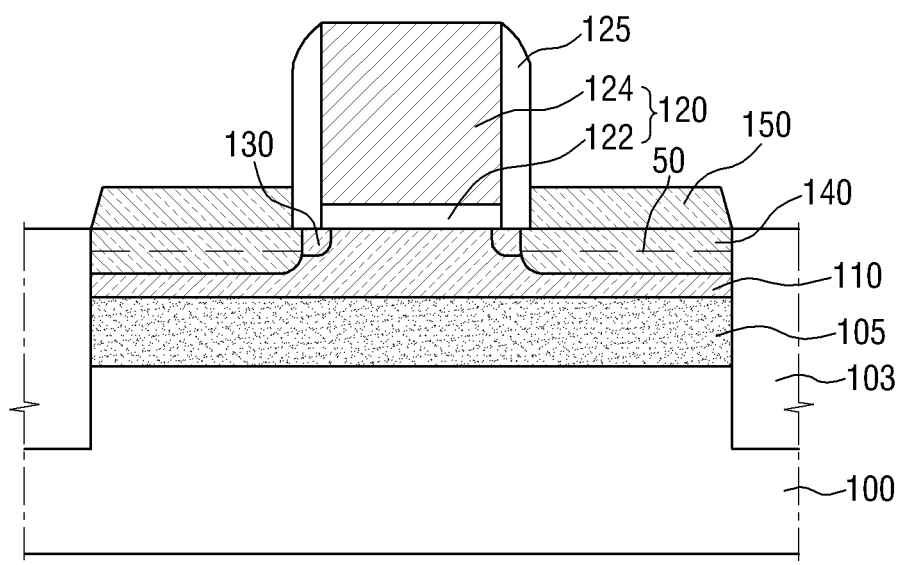

Referring to FIG. 7, a second semiconductor layer 150 that projects above the upper surface of the first semiconductor layer 110 is formed on the first re-crystallization region 140, that is, the first source/drain region 140.

The second semiconductor layer 150 may be formed using, for example, an epitaxial growth process. For example, the second semiconductor layer 150 may be an epitaxial layer that is formed on the upper surface of the first re-crystallization region 140.

Further, the second semiconductor layer 150 may include the second type impurity that is included in the first re-crystallization region 140.

In the method for fabricating a semiconductor device according to certain exemplary embodiments, since the first re-crystallization region 140 is made of silicon, the second semiconductor layer 150 may be a silicon epitaxial layer, but is not limited thereto.

Referring to FIGS. 1 to 3, and 7 to 10, a method for fabricating a semiconductor device according to a second exemplary embodiment will be described. Description will be made around different points between this embodiment and the above-described embodiment.

Figure 8:
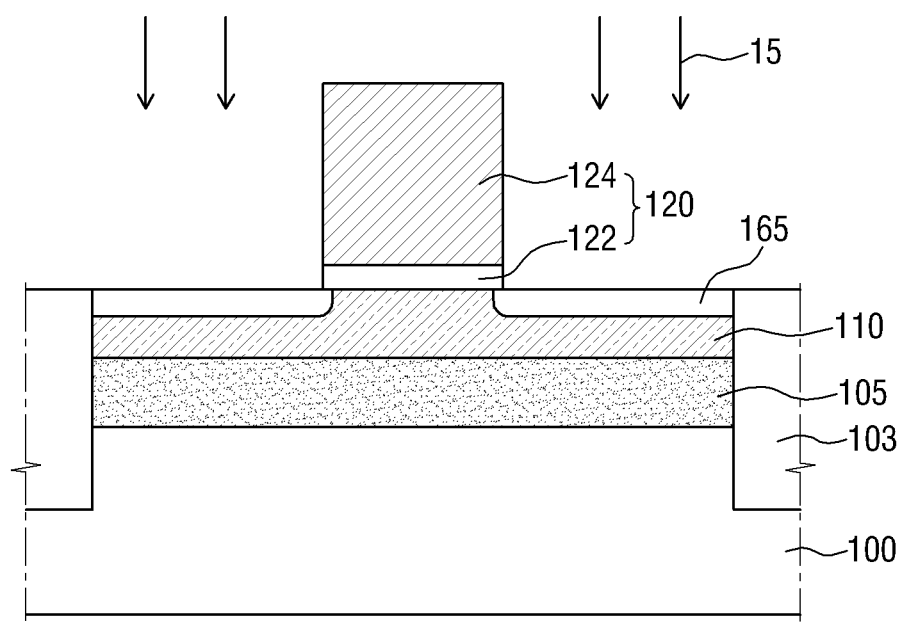
FIGS. 8 to 10 are views of intermediate steps explaining an exemplary method for fabricating a semiconductor device according to a second embodiment.
Figure 9:
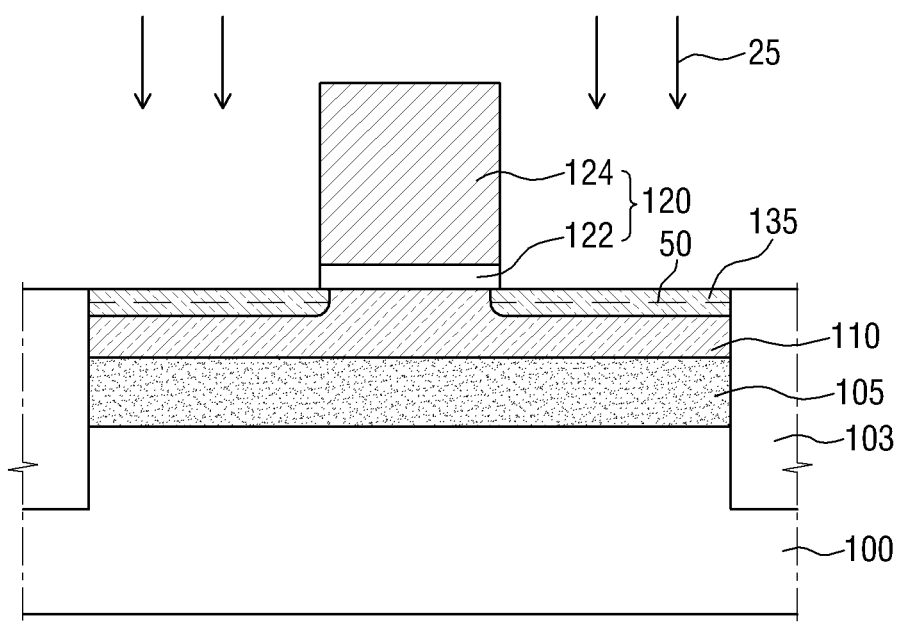
Figure 10:
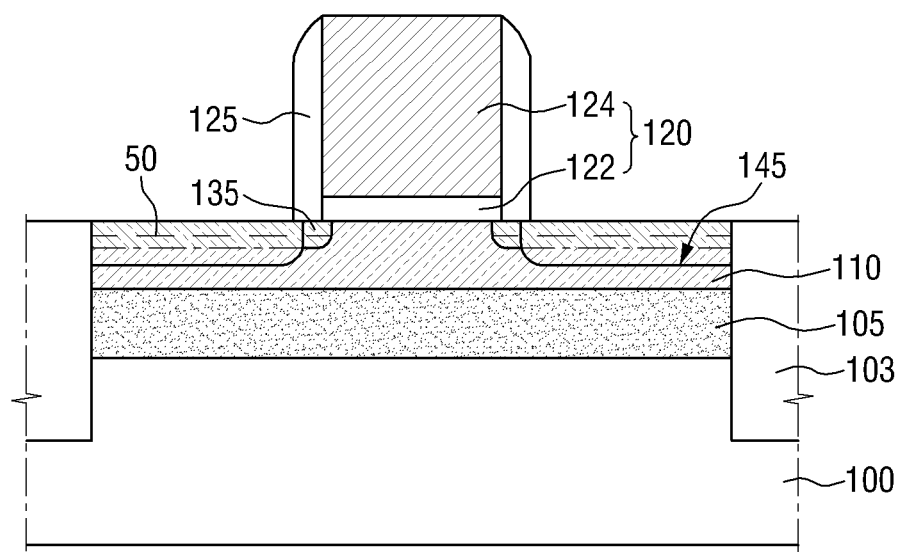

FIGS. 8 to 10 are views of intermediate steps explaining a method for fabricating a semiconductor device according to a second embodiment.

Referring to FIG. 8, a second amorphous region 165 is formed on both sides of the first gate structure 120 through a second amorphization process 15. The second amorphous region 165 is formed inside the first semiconductor layer 110. Thus, a part of the first semiconductor layer 110, which is not covered by the first gate structure 120, is amorphized. Thus, in this example, an amorphization process may occur prior to the formation of a gate spacer. In addition, the amorphization process may occur prior to a doping of the first semiconductor layer 110 with a second-type impurity.

The second amorphization process 15 may be, for example, a PAI process. In the second amorphization process 15, the first gate structure 120 may be used as a mask. The second amorphous region 165 that is formed through the second amorphization process 15 may be formed to expand up to the lower portion of the first gate structure 120. In one embodiment, the amorphous region 165 extends from the isolation layer 103 to an edge of the first gate structure 120. The amorphous region 165 may also extend past the edge to overlap vertically with the first gate structure 120. Thus, in one embodiment, a top surface of the amorphous region 165 contacts a bottom surface of the gate structure 120.

In the method for fabricating a semiconductor device according to the embodiment shown in FIGS. 8-10, the second amorphous region 165 that is formed inside the first semiconductor layer 110 does not come in contact with the lower screen layer 105. For example, since the first semiconductor layer 110 is positioned between the second amorphous region 165 and the screen layer 105, the screen layer 105 is not affected by the second amorphization process 15. In this embodiment, the depth that is measured from the upper surface of the first semiconductor layer 110 to the lowermost portion of the second amorphous region 165 is smaller than the thickness of the first semiconductor layer 110.

The second amorphous region 165 may become a source/drain expansion region through the subsequent fabricating process. Accordingly, the depth, in which the second amorphous region 165 is formed, may be smaller than the depth, in which the first amorphous region 160 is formed as described above referring to FIG. 5.

The second type impurity, which is different from the first type impurity that is included in the screen layer 105, may be doped into the second amorphous region 165. As a result, the second amorphous region 165 may become the source/drain expansion region. In one embodiment, if the transistor is a pFET, the second type impurity that is doped into the second amorphous region 165 includes the p-type impurity, while if the transistor is an nFET, the second type impurity that is doped into the second amorphous region 165 includes the n-type impurity. The p-type impurity may be, for example, boron (B), and the n-type impurity may be, for example, phosphorous (P), arsenide (As), or antimony (Sb).

The doping of the second type impurity into the second amorphous region 165 may be performed using, for example, an implantation process.

Referring to FIG. 9, by performing second heat treatment 25 with respect to the second amorphous region 165, the second amorphous region 165 is re-crystallized. By performing the second heat treatment 25 with respect to the second amorphous region 165, a second re-crystallization region 135 is formed on both sides of the first gate structure 120.

By re-crystallizing the second amorphous region 165 through the second heat treatment 25, the second source/drain expansion region 135 may be formed on both sides of the first gate structure 120. The second source/drain expansion region 135 may include the second type impurity.

Since the second source/drain expansion region 135 is formed through re-crystallization of the second amorphous region 165, the second source/drain expansion region 135, which is formed by the second heat treatment 25, does not come in contact with the screen layer 105.

The second re-crystallization region 135 may be formed using, for example, the SPE process.

In the method for fabricating a semiconductor device according to this embodiment, the second source/drain expansion region 135 that is formed through the second heat treatment 25 may include stacking fault 50. The stacking fault 50 that is included in the second source/drain expansion region 135 is positioned on the screen layer 105.

In the method for fabricating a semiconductor device according to the above embodiment, the second heat treatment 25 to form the second re-crystallization region 135 may be performed using the SMT.

Referring to FIG. 10, a gate spacer 125 is formed on a side surface of the first gate structure 120.

The gate spacer 125 overlaps a part of the second re-crystallization region 135 that includes the stacking fault 50. In one embodiment, the second source/drain expansion region 135 that includes the stacking fault 50 is positioned on a lower portion of the gate spacer 125.

Then, a second source/drain region 145 is formed on both sides of the first gate structure 120. Specifically, the second source/drain region 145 is formed on a side surface of the gate spacer 125.

The second source/drain region 145 may be formed inside the second source/drain expansion region 135 and the first semiconductor layer 110. Accordingly, the second source/drain region 145 may include a part of the first semiconductor layer 110 and a part of the second source/drain expansion region 135. The second source/drain region 145 that is formed inside the second source/drain expansion region 135 may include the stacking fault 50.

The lowermost surface of the second source/drain region 145 is closer to the screen layer 105 than the lowermost surface of the second source/drain expansion region 135. However, the second source/drain region 145 does not come in contact with the screen layer 105.

The second source/drain region 145 includes the second type impurity, which is different from the first type impurity, included in the screen layer 105. The second type impurity that is doped into the second source/drain region 145 may be the same as the second type impurity that is included in the second re-crystallization region 135, but is not limited thereto.

The doping of the second type impurity into the second source/drain region 145 may be performed using, for example, an implantation process.

Then, referring to FIG. 7, a second semiconductor layer 150 that projects above the upper surface of the first semiconductor layer 110 may be formed on the second source/drain region 145.

In the method for fabricating a semiconductor device according to the embodiment of FIGS. 8-10, the second source/drain region 145 is formed through doping of the second type impurity, but is not limited thereto.

As described above with reference to FIGS. 8-10, the first amorphous region 165 is formed in the second source/drain expansion region 135 and the first semiconductor layer 110 through the second amorphization process 15. Further, the second type impurity is doped into the first amorphous region 165. Thereafter, the second source/drain region 145 can be formed through re-crystallization of the first amorphous region 165 that is doped with the second type impurity through the first heat treatment 20.

Thus, after the second source/drain expansion region 135 is formed using the second amorphization process 15, the second source/drain region 145 may be formed using the first heat treatment 20.

Referring to FIGS. 1 to 7 and 11 to 13, a method for fabricating a semiconductor device according to a further embodiment will be described. Description will be made around the different points between this embodiment and the embodiment as described above with reference to FIGS. 1 to 7.

Figure 11:
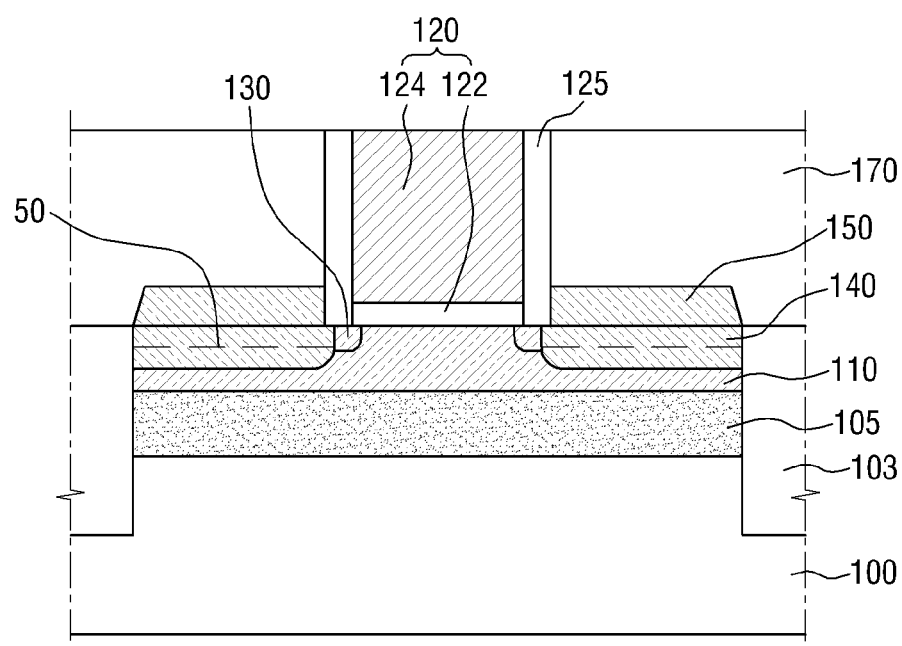
FIGS. 11 to 13 are views of intermediate steps explaining an exemplary method for fabricating a semiconductor device according to a third embodiment.
Figure 12:
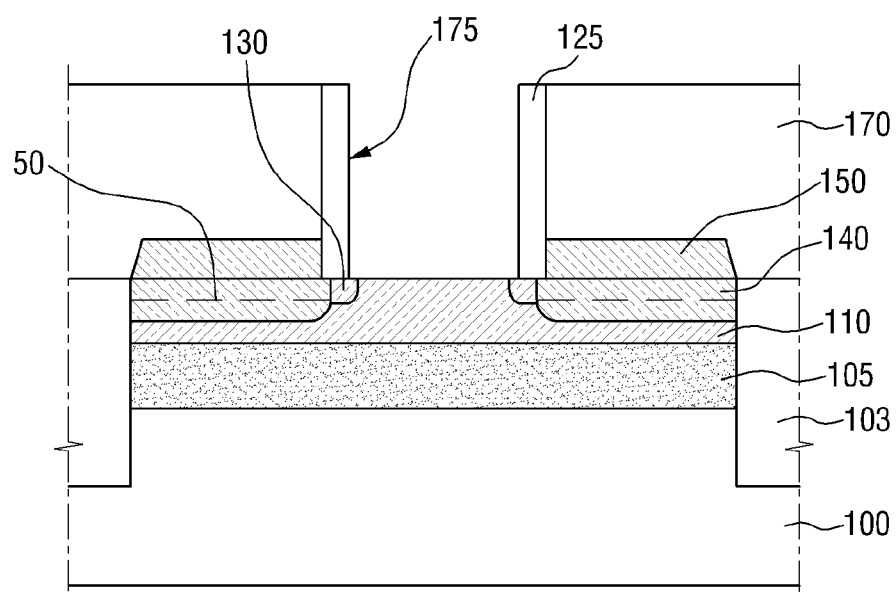
Figure 13:
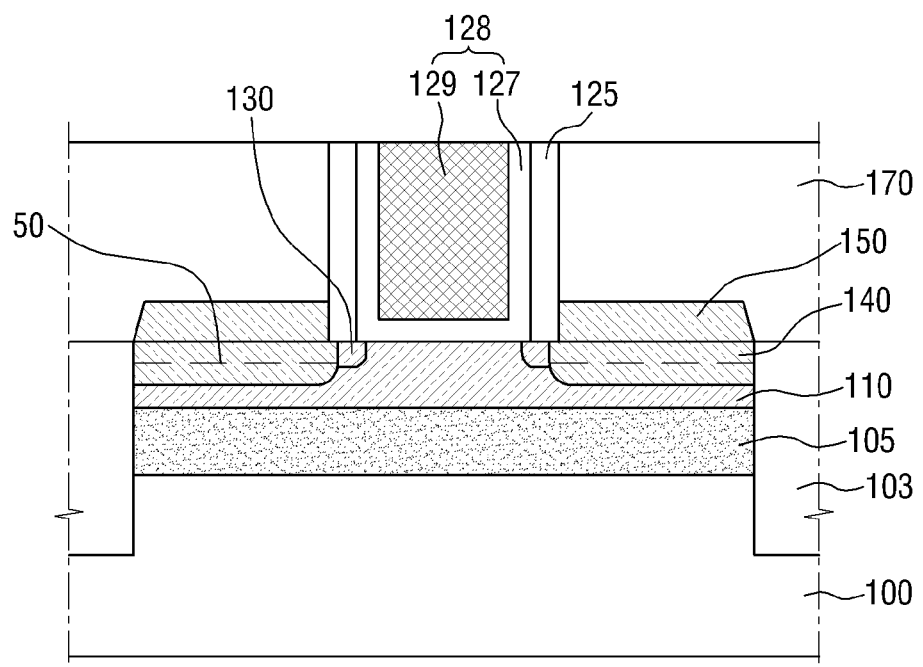

FIGS. 11 to 13 are views of intermediate steps explaining a method for fabricating a semiconductor device according to a further exemplary embodiment.

Referring to FIG. 11, an interlayer insulating layer 170, which covers a second semiconductor layer 150 and a first gate structure 120, is formed on a substrate 100.

The interlayer insulating layer 170 may include, for example, at least one of a low-k material layer, an oxide layer, a nitride layer, and an oxynitride layer. The low-k material may be, for example, FOX (Flowable Oxide), TOSZ (Tonen SilaZen), USG (Undoped Silica Glass), BSG (Borosilica Glass), PSG (PhosphoSilica Glass), BPSG (BoroPhosphoSilica Glass), PRTEOS (Plasma Enhanced Tetra Ethyl Ortho Silicate), FSG (Fluoride Silicate Glass), HDP (High Density Plasma), PEOX (Plasma Enhanced Oxide), FCVD (Flowable CVD), or a combination thereof, but is not limited thereto.

Then, through planarization of the interlayer insulating layer 170, the first gate structure 120 is exposed. For example, through a planarization process, the upper surface of the first gate structure 120, for example, a first gate electrode 124, may be exposed. For example, the planarization process may be a CMP (Chemical Mechanical Polishing) process.

Referring to FIG. 12, the first gate electrode 124 is removed. After the first gate electrode 124 is removed, a trench 175 is formed through removal of a first gate insulating layer 122. A first semiconductor layer 110 may be exposed through the trench 175.

As a result, the interlayer insulating layer 170 that includes the trench 175 is formed on the first semiconductor layer 110.

In the method for fabricating a semiconductor device according to this embodiment of, the first gate structure 120 may be a dummy gate structure.

Referring to FIG. 13, a second gate insulating layer 127 is formed along a side surface and a bottom surface of the trench 175. A second gate electrode 129 is formed to fill the trench 175 on which the second gate insulating layer 127 is formed. The second gate electrode 129 may be a replacement metal gate.

By forming the second gate insulating layer 127 and the second gate electrode 129 in the trench 175, a second gate structure 128 is formed on the first semiconductor layer 110.

The second gate insulating layer 127 may include, for example, a high-k dielectric layer. The second gate insulating layer 127 may be formed using chemical vapor deposition or atomic layer deposition (ALD).

The second gate electrode 129 may include, for example, at least one of TiN, TaN, TiC, TaC, W, and Al. Although the second gate electrode 129 is illustrated as a single layer, it may be a stacked layer in which two or more metal layers are stacked.

The embodiment described in FIGS. 11-13 may be combined with either of the embodiments described previously.

The term "semiconductor device" as used herein may refer to a transistor such as described in FIGS. 1-13, but may also refer to an integrated circuit, a semiconductor chip, a stack of semiconductor chips, a chip stack package, or a package-on-package device, for example.

Figure 14:
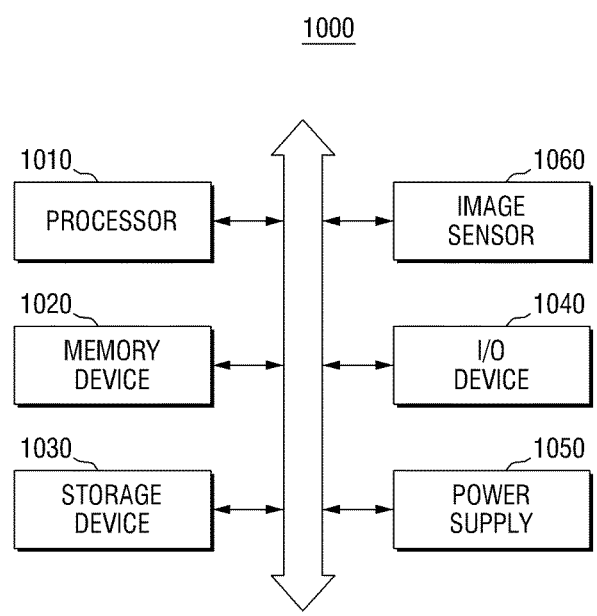
FIG. 14 is a block diagram illustrating an example of an image sensor including a semiconductor device fabricated by an exemplary method for fabricating a semiconductor device according to certain disclosed embodiments, which are applied to, for example, a computing system.

FIG. 14 is a block diagram illustrating an example of an image sensor including a semiconductor device fabricated by a method for fabricating a semiconductor device according to the present disclosed embodiments, which is applied to, for example, a computing system.

Referring to FIG. 14, a computing system 1000 includes a processor 1010, a memory device 1020, a storage device 1030, an input/output (I/O) device 1040, a power supply 1050, and an image sensor 1060.

The image sensor 1060 may be an image sensor that includes the semiconductor device that is fabricated according to any one of the embodiments described above. For example, one or more transistors of an image sensor may be formed using one or more of the methods described above. Although not illustrated in FIG. 14, the computing system 1000 may further include ports for communicating with a video card, a sound card, a memory card, a USB device, or other electronic devices.

The processor 1010 may perform specific calculations or tasks. Depending on the embodiments, the processor 1010 may be a microprocessor or a central processing unit (CPU).

The processor 1010 may perform communication with the memory device 1020, the storage device 1030, and the I/O device 1040 through an address bus, a control bus, and a data bus.

Depending on the embodiments, the processor 1010 may be connected to an extension bus, such as a PCI (Peripheral Component Interconnect) bus. The memory device 1020 may store data required to operate the computing system 1000.

For example, the memory device 1020 may be implemented by DRAM, mobile DRAM, SRAM, PRAM, FRAM, RRAM, and/or MRAM. The storage device 1030 may include a SSD (Solid State Drive), HDD (Hard Disk Drive), and CD-ROM.

The I/O device 1040 may include input means, such as a keyboard, a keypad, and a mouse, and output means, such as a printer and a display. The power supply 1050 supplies operation voltages required to operate the electronic device 1000.

The image sensor 1060 may be connected to and communicate with the processor 1010 through buses or other communication links. As described above, the image sensor 1060 may generate accurate image data through compensating for offsets with respect to a reference voltage. The image sensor 1060 may be integrated into one chip together with the processor 1010, or may be integrated into a different chip.

The computing system 1000 may be construed as one of many computing systems using image sensors. For example, the computing system 1000 may include a digital camera, a mobile phone, a PDA (Personal Digital Assistant), a PMP (Portable Multimedia Player), a smart phone, and a tablet PC.

Figure 15:
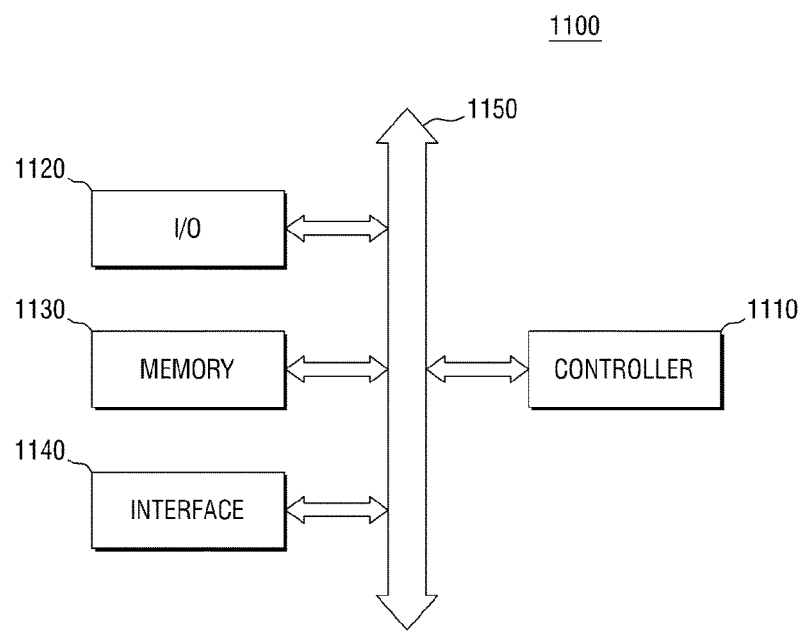
FIG. 15 is a block diagram of an exemplary electronic system including a semiconductor device fabricated according to some embodiments.

FIG. 15 is a block diagram of an electronic system including a semiconductor device fabricated according to some exemplary embodiments.

Referring to FIG. 15, an electronic system 1100 according to certain embodiments may include a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 corresponds to paths through which data is transferred.

The controller 1110 may include at least one of a microprocessor, a digital signal processor, a microcontroller, and logic elements that can perform similar functions. The I/O device 1120 may include a keypad, a keyboard, and a display device. The memory 1130 may store data and/or commands. The interface 1140 may function to transfer the data to a communication network or receive the data from the communication network. The interface 1140 may be of a wired or wireless type. For example, the interface 1140 may include an antenna or a wire/wireless transceiver. Although not illustrated, the electronic system 1100 may further include a high-speed DRAM and/or SRAM as an operating memory for improving the operation of the controller 1110. The semiconductor device according to the embodiments discussed above may be provided inside the memory 1130 or may be provided as a part of the controller 1110 or the I/O device 1120. For example, one or more transistors of the memory 1130, controller 1110, and/or I/O device 1120 may be formed according to one or more of the methods described above.

The electronic system 1100 may be applied to a PDA (Personal Digital Assistant), a portable computer, a web tablet, a wireless phone, a mobile phone, a digital music player, a memory card, or other electronic devices that can transmit and/or receive information in wireless environments.

Figure 16:
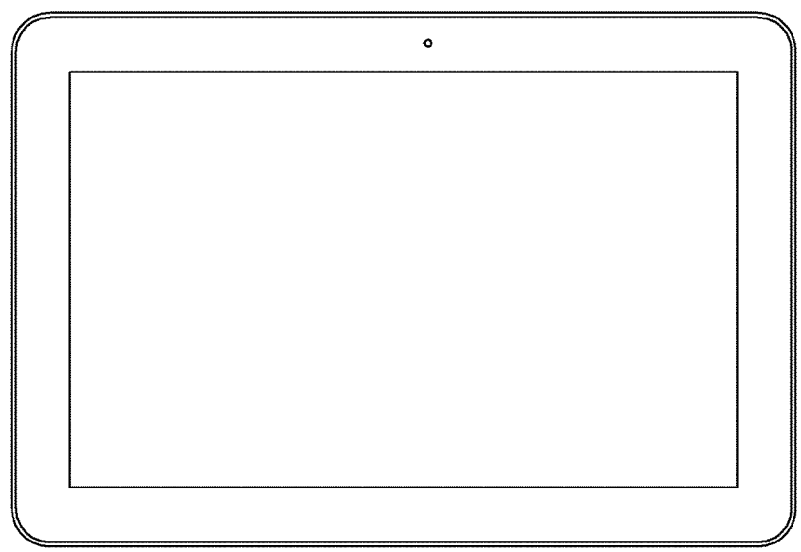
FIGS. 16 and 17 are exemplary views illustrating an exemplary semiconductor system to which a semiconductor device fabricated according to some embodiments can be applied.
Figure 17:
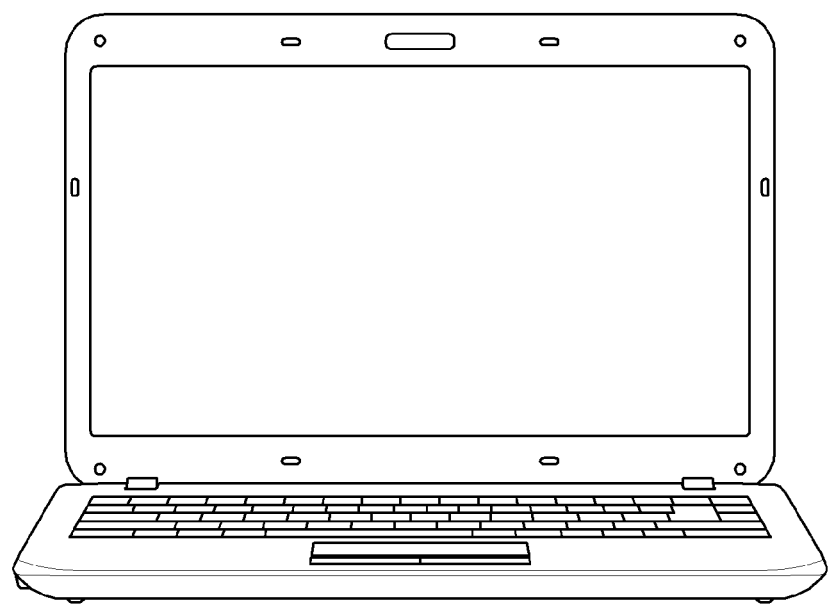

FIGS. 16 and 17 are exemplary views illustrating a semiconductor system to which a semiconductor device fabricated according to some exemplary embodiments can be applied. FIG. 16 illustrates a tablet PC, and FIG. 17 illustrates a notebook PC. At least one of the semiconductor devices fabricated according to the embodiments described above may be used in the tablet PC or the notebook PC. It should be apparent to those of skilled in the art that the semiconductor device fabricated according to the disclosed embodiments can be applied even to other integrated circuit devices that have not been exemplified.

Although exemplary embodiments of the present inventive concept have been described for illustrative purposes, those skilled in the art will appreciate that various modifications, additions and substitutions are possible, without departing from the scope and spirit of the inventive concept as disclosed in the accompanying claims.

What is claimed is:

1. A method of providing a semiconductor device, comprising:
    providing a semiconductor substrate;
    providing a screen layer on the semiconductor substrate, including a portion doped with a first type impurity;
    providing a semiconductor layer including an undoped portion on the screen layer, such that the screen layer is between the semiconductor substrate and the semiconductor layer;
    providing a gate structure on the semiconductor layer;
    providing a source/drain expansion region in the semiconductor layer, the source/drain expansion region having a second type impurity different from the first type, and the source/drain expansion region extending from a surface of the semiconductor layer to a first depth within the semiconductor layer;
    providing a source/drain region on both sides of the gate structure, the source/drain region including at least part of the source/drain expansion region, the source/drain region extending from the surface of the semiconductor layer to a second depth within the semiconductor layer different from the first depth;
    wherein the undoped portion of the semiconductor layer is disposed at a depth greater than the second depth, and
    wherein the entirety of the source/drain region vertically overlaps with the screen layer.

2. The method of claim 1, further comprising:
    forming an amorphous region in order to form the source/drain region;
    providing the source/drain region on both sides of the gate structure through performing heat treatment of the amorphous region to form a re-crystallization region;
    doping the second type impurity into the amorphous region before performing the heat treatment of the amorphous region, and
    re-crystallizing the amorphous region to form the source/drain region, the source/drain region including the second type impurity.

3. The method of claim 1, wherein the second depth is greater than the first depth.

4. The method of claim 1, wherein the portion of the screen layer is doped with the first type impurity in the range of 7E18 to 1E20, the undoped portion of the semiconductor layer is formed to contact the screen layer, and the semiconductor layer includes the first type impurity in the range of 1E14 to 3E17.

5. A method of fabricating a semiconductor device comprising:
    forming a screen layer on a substrate, the screen layer including a first portion doped with a first type impurity in the range of 7E18 to 1E20;
    forming a first undoped semiconductor layer on the screen layer;
    forming a gate structure on the first semiconductor layer;
    forming a first amorphous region on both sides of the gate structure in the first semiconductor layer;
    re-crystallizing the first amorphous region through performing a first heat treatment of the first amorphous region;
    doping a second type impurity that is different from the first type impurity into the first amorphous region before performing the first heat treatment of the first amorphous region,
    wherein the re-crystallizing the first amorphous region includes forming a source/drain region that includes the second type impurity; and
    forming a second semiconductor layer, which projects above an upper surface of the first semiconductor layer, on the source/drain region after forming the source/drain region, the second semiconductor layer vertically overlapping the screen layer.

6. The method of claim 5, wherein the first amorphous region is formed using a PAI (Pre Amorphous ion Implantation) process.

7. The method of claim 5, wherein a depth that is measured from an upper surface of the first semiconductor layer to a lowermost portion of the first amorphous region is smaller than a thickness of the first semiconductor layer.

8. The method of claim 5, wherein the first semiconductor layer is formed to contact the screen layer, and the first semiconductor layer includes the first type impurity in the range of 1E14 to 3E17.

9. The method of claim 5, wherein the forming the first semiconductor layer includes using an epitaxial process.

10. The method of claim 5, further comprising forming an interlayer insulating layer covering the gate structure on the first semiconductor layer after performing the first heat treatment, exposing the gate structure through planarization of the interlayer insulating layer, forming a trench exposing the first semiconductor layer in the interlayer insulating layer through removal of the gate structure, and forming a replacement metal gate that fills the trench.

11. The method of claim 5, further comprising:
forming a source/drain expansion region prior to forming the first amorphous region.

12. The method of claim 11, wherein the first amorphous region is formed to be deeper than the source/drain expansion region.

13. A method for fabricating a semiconductor device comprising:
forming a screen layer on a substrate, the screen layer including a portion doped with a first type impurity;
forming an undoped semiconductor layer on the screen layer using an epitaxial process;
forming a gate structure on the semiconductor layer;
forming a gate spacer on the gate structure;
after forming the gate spacer, forming an amorphous region, which vertically overlaps the screen layer and does not come in contact with the screen layer, in the semiconductor layer through performing a PAI (Pre Amorphous ion Implantation) process using the gate structure and gate spacer as a mask; and
forming a re-crystallization region on both sides of the gate structure through performing heat treatment of the amorphous region.

14. The method of claim 13, further comprising doping a second type impurity that is different from the first type impurity into the amorphous region before performing the heat treatment of the amorphous region,
wherein the forming the re-crystallization region includes forming a source/drain region that includes the second type impurity.

15. The method of claim 14, further comprising:
forming a source/drain expansion region prior to forming the gate spacer, a portion of the source/drain expansion region formed under the gate structure; and
forming the amorphous region and re-crystallization region to form the source/drain region, wherein:
the source/drain expansion region under the gate structure does not undergo the amorphization or re-crystallization.

16. The method of claim 13, further comprising doping a second type impurity that is different from the first type impurity into the amorphous region before performing the heat treatment of the amorphous region,
wherein the forming the re-crystallization region includes forming a source/drain expansion region that includes the second type impurity.

17. The method of claim 16, further comprising forming a source/drain region in the source/drain expansion region.

* * * * *